(12) United States Patent
He et al.

(10) Patent No.: US 9,379,221 B1
(45) Date of Patent: Jun. 28, 2016

(54) BOTTOM-UP METAL GATE FORMATION ON REPLACEMENT METAL GATE FINFET DEVICES

(71) Applicant: International Business Machines Corporation, Armonk, NY (US)

(72) Inventors: Hong He, Schenectady, NY (US); Juntao Li, Cohoes, NY (US); Junli Wang, Singerlands, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/592,042

(22) Filed: Jan. 8, 2015

(51) Int. Cl.
| H01L 21/4763 | (2006.01) |
| H01L 29/66 | (2006.01) |
| H01L 29/78 | (2006.01) |
| H01L 21/321 | (2006.01) |
| H01L 21/311 | (2006.01) |
| H01L 21/28 | (2006.01) |

(52) U.S. Cl.
CPC ...... *H01L 29/6681* (2013.01); *H01L 21/28079* (2013.01); *H01L 21/28088* (2013.01); *H01L 21/31133* (2013.01); *H01L 21/32115* (2013.01); *H01L 29/7851* (2013.01)

(58) Field of Classification Search
None
See application file for complete search history.

(56) References Cited

U.S. PATENT DOCUMENTS

| 5,585,673 | A | 12/1996 | Joshi et al. |
| 5,695,810 | A | 12/1997 | Dubin et al. |
| 6,323,554 | B1 | 11/2001 | Joshi et al. |
| 6,342,733 | B1 | 1/2002 | Hu et al. |
| 6,706,625 | B1 | 3/2004 | Sudijono et al. |
| 6,967,131 | B2 | 11/2005 | Saenger et al. |
| 6,975,032 | B2 | 12/2005 | Chen et al. |
| 8,013,401 | B2 | 9/2011 | Lavoie et al. |
| 8,466,063 | B2 | 6/2013 | Lin et al. |
| 8,507,979 | B1 * | 8/2013 | Huang et al. ............ 257/330 |
| 8,629,007 | B2 | 1/2014 | Haran et al. |
| 2004/0113279 | A1 | 6/2004 | Chen et al. |
| 2007/0262451 | A1 * | 11/2007 | Rachmady et al. ............ 257/758 |
| 2008/0258216 | A1 * | 10/2008 | Kikuchi ............ 257/344 |

(Continued)

OTHER PUBLICATIONS

Kesapragada et al., "High-k / Metal Gate Stacks in Gate First and Replacement Gate Schemes," Advanced Semiconductor Manufacturing Conference (ASMC), 2010, pp. 256-259.

(Continued)

*Primary Examiner* — Reema Patel
(74) *Attorney, Agent, or Firm* — Cantor Colburn LLP; Vazken Alexanian

(57) ABSTRACT

A method of fabricating a replacement metal gate in a transistor device, a fin field effect transistor (finFET), and method of fabricating a finFET device with the replacement metal gate are described. The method of fabricating the replacement metal gate includes forming a dummy gate structure over a substrate, the dummy gate structure being surrounded by an insulating layer, and removing the dummy gate structure so as to expose a trench within the insulating layer. The method also includes conformally depositing a dielectric material layer and a work function metal layer over a the insulating layer and in the trench and removing the dielectric material layer and the work function metal layer from a tip surface of the insulating layer, recessing the work function metal layer below a top of the trench, and selectively forming a gate metal only on exposed surfaces of the work function metal layer.

14 Claims, 10 Drawing Sheets

(56) References Cited

U.S. PATENT DOCUMENTS

| | | |
|---|---|---|
| 2011/0298061 A1 | 12/2011 | Siddiqui et al. |
| 2012/0001263 A1 | 1/2012 | Richter et al. |
| 2012/0235249 A1 | 9/2012 | Kronholz et al. |
| 2012/0292715 A1* | 11/2012 | Hong et al. ............ 257/392 |
| 2013/0065371 A1 | 3/2013 | Wei et al. |
| 2013/0187203 A1* | 7/2013 | Xie et al. ............ 257/288 |
| 2013/0299918 A1 | 11/2013 | Kim et al. |
| 2015/0108577 A1* | 4/2015 | Cai .......... H01L 21/28008 257/369 |

OTHER PUBLICATIONS

International Search Report and Written Opinion for PCT Application No. PCT/IB2016/050022, dated Apr. 15, 2016, pp. 1-13.

* cited by examiner

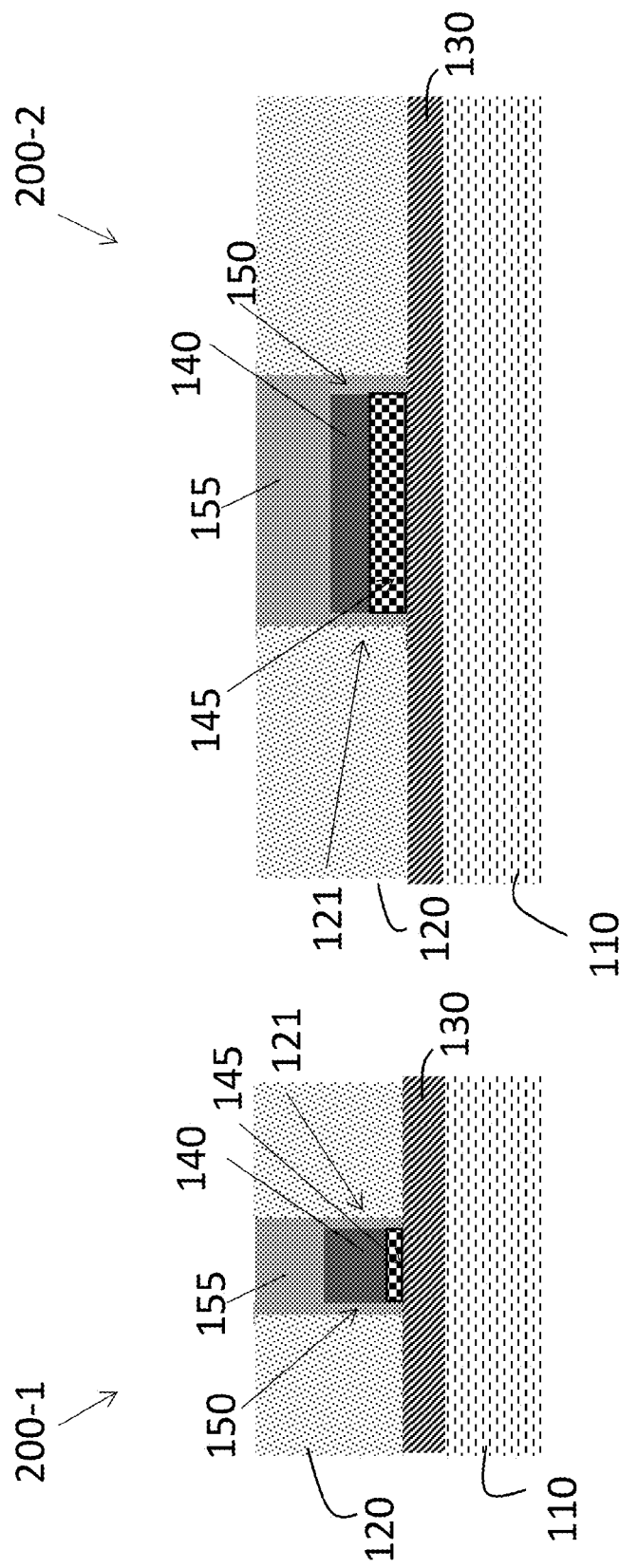

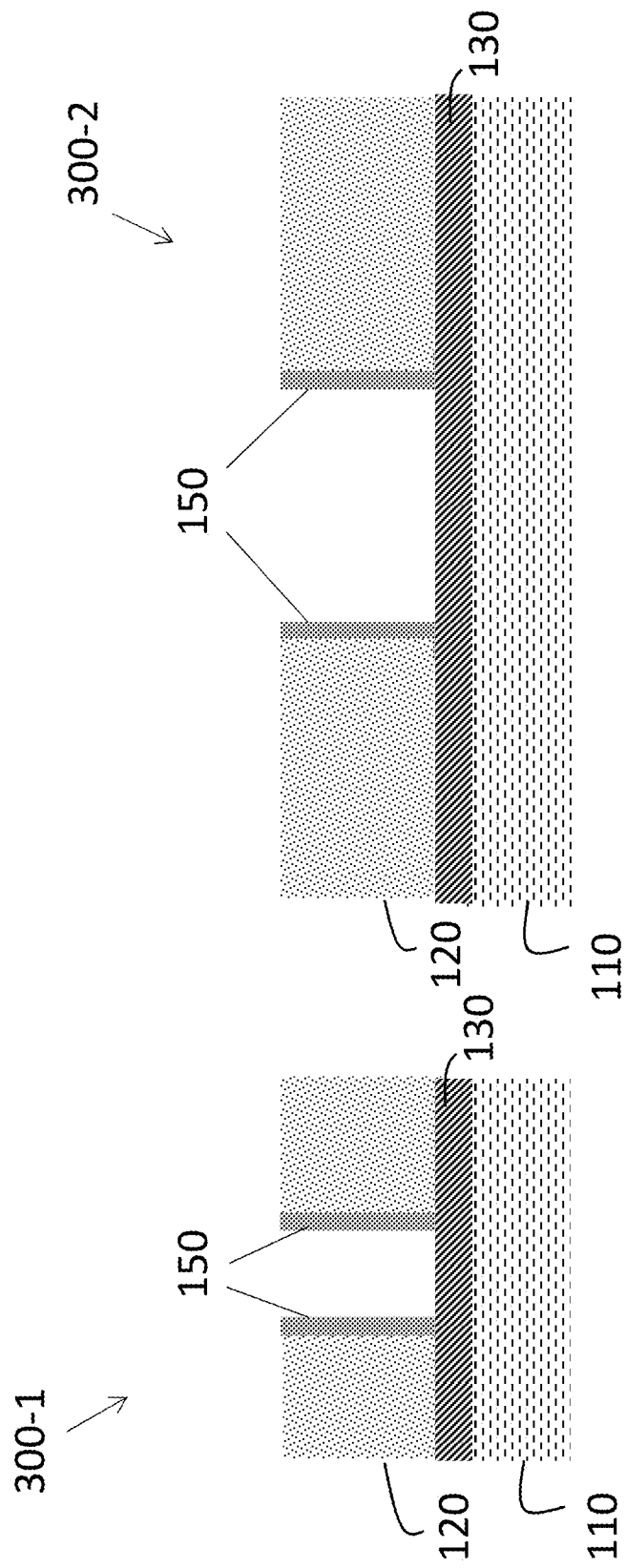

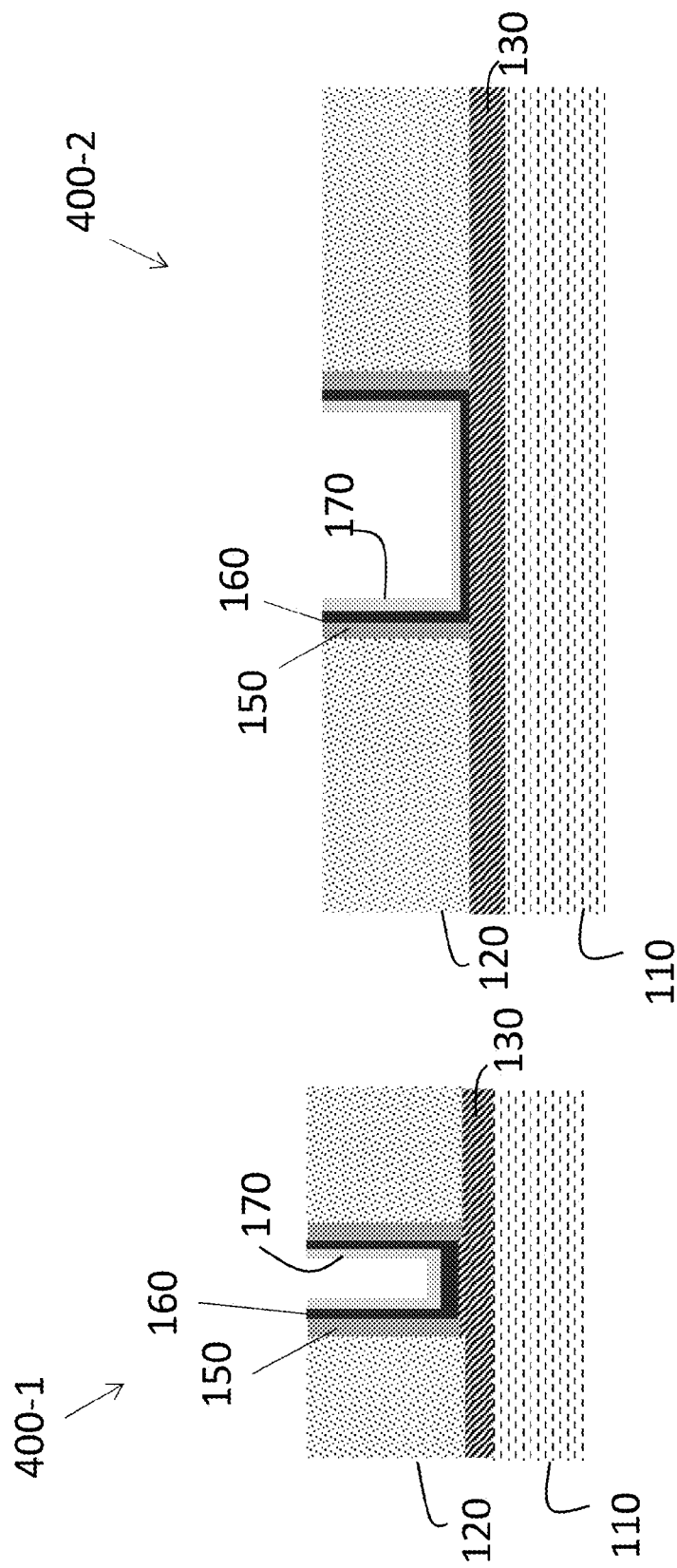

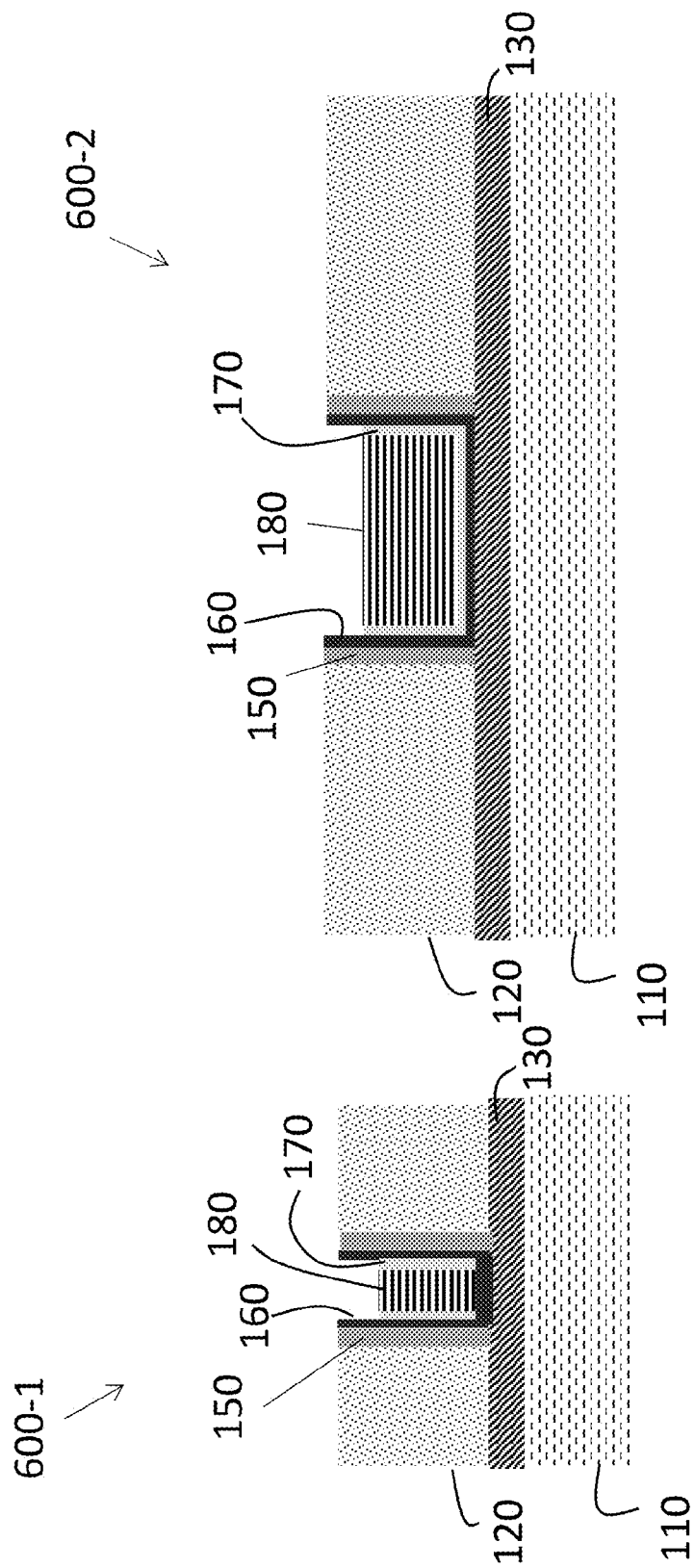

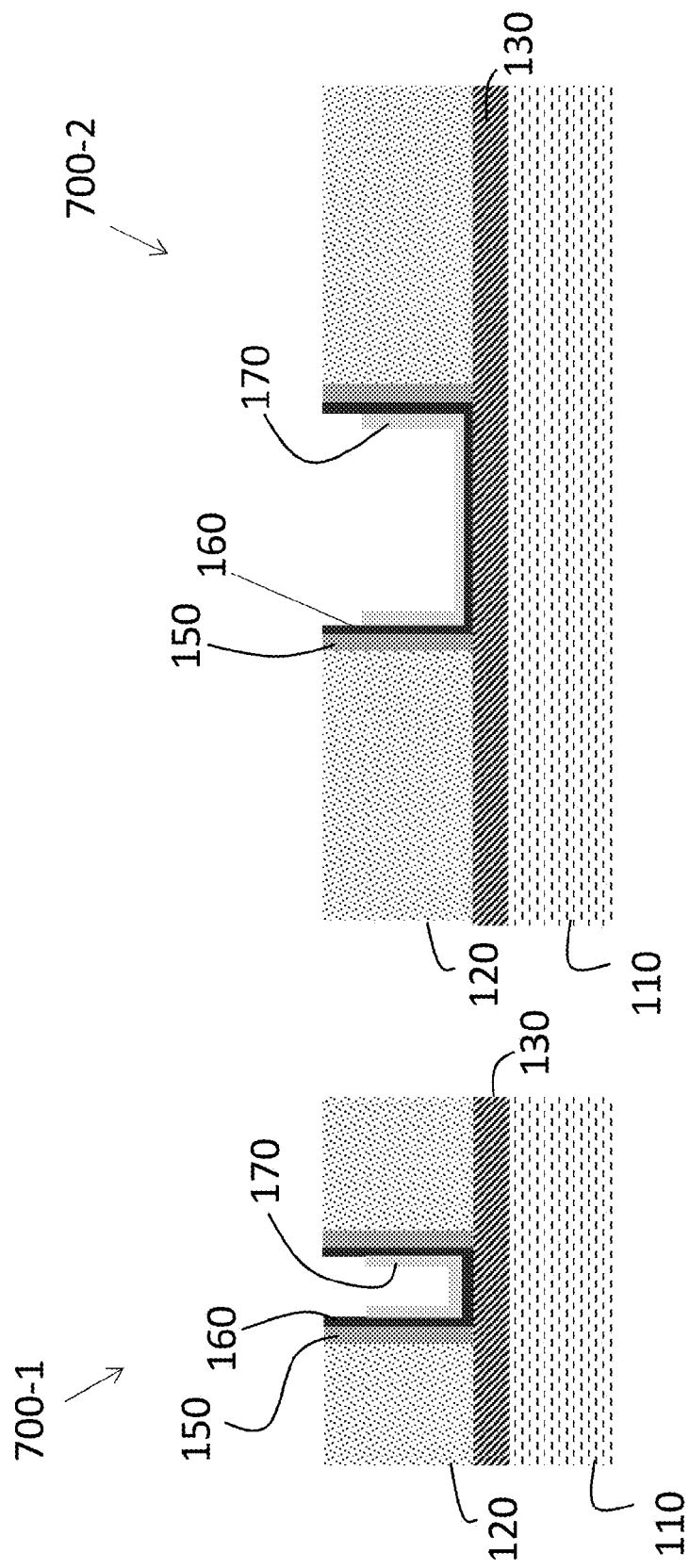

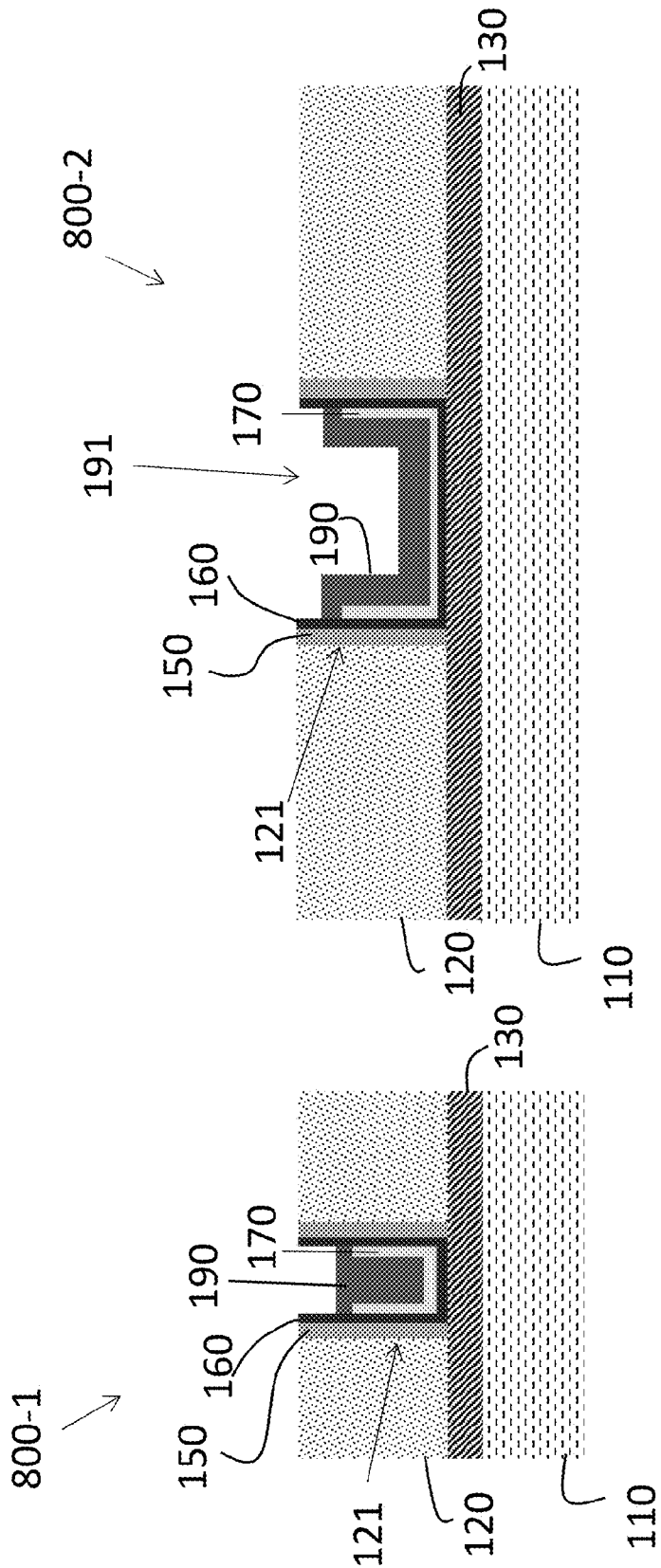

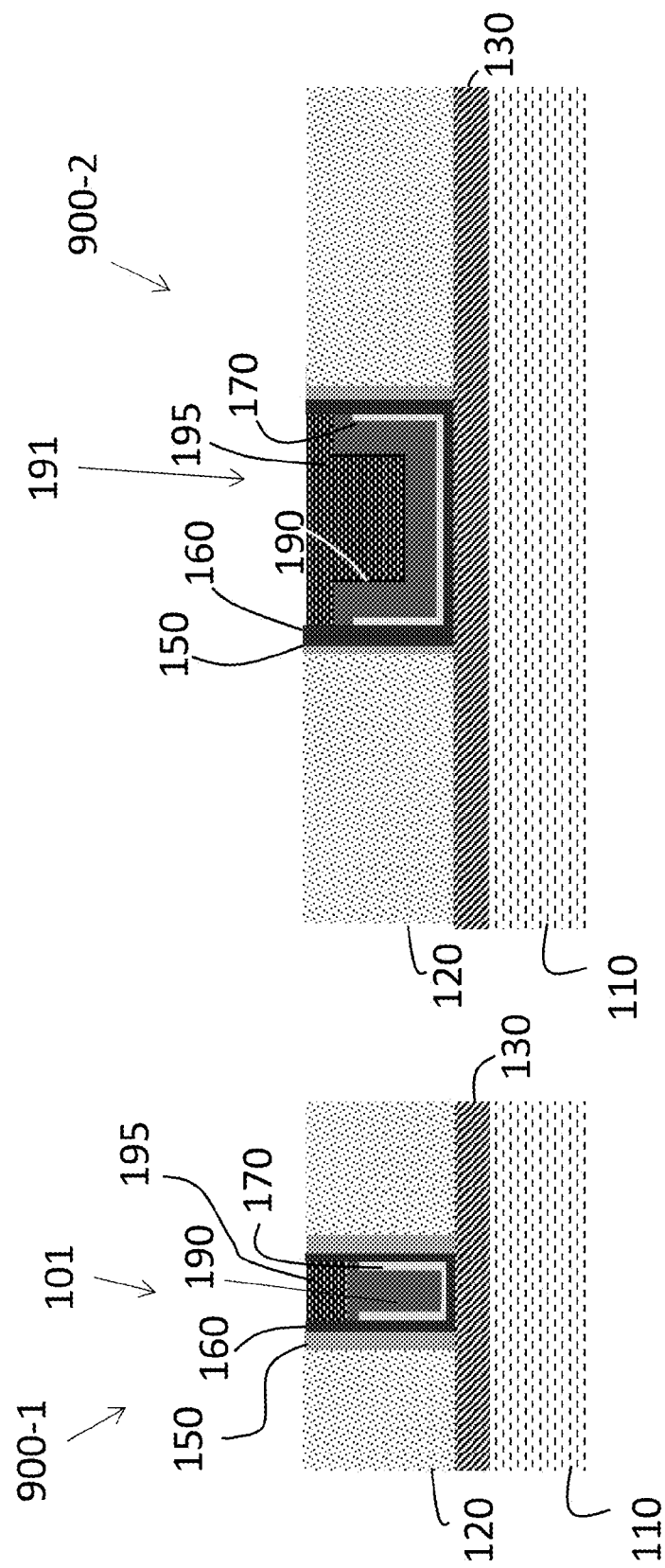

BOTTOM-UP METAL GATE FORMATION ON REPLACEMENT METAL GATE FINFET DEVICES

BACKGROUND

The present invention relates to metal gate formation, and more specifically, to metal gate formation on replacement metal gate fin field effect transistor (finFET) devices.

Generally, a replacement metal gate (RMG) process architecture is a gate last versus a gate first architecture. RMG finFET device fabrication typically includes initially forming a dummy gate structure that is subsequently removed to form a gate pocket after spacer etch and source/drain epitaxy merge. A high dielectric constant (high-k) layer, work function metal, and gate metal are filled into the gate pocket, and chemical-mechanical planarization (CMP) is performed to planarize the topology. The gate metal material is then recessed partially and a dielectric cap is formed through damascene processing.

SUMMARY

According to one embodiment of the present invention, a method of fabricating a replacement metal gate in a transistor device includes forming a dummy gate structure over a substrate, the dummy gate structure surrounded by an insulating layer; removing the dummy gate structure so as to expose a trench within the insulating layer; conformally depositing a dielectric material layer and a work function metal layer over a the insulating layer and in the trench and removing the dielectric material layer and the work function metal layer from a tip surface of the insulating layer; recessing the work function metal layer below a top of the trench; and selectively forming a gate metal only on exposed surfaces of the work function metal layer.

According to another embodiment, a method of fabricating a fin field effect transistor (finFET) device includes forming a substrate; forming a fin connecting a source region and a drain region over the substrate; forming a dummy gate structure over a substrate, the dummy gate structure surrounded by an insulating layer; removing the dummy gate structure so as to expose a trench within the insulating layer; conformally depositing a dielectric material layer and a work function metal layer over a the insulating layer and in the trench and removing the dielectric material layer and the work function metal layer from a tip surface of the insulating layer; recessing the work function metal layer below a top of the trench; and selectively forming a gate metal only on exposed surfaces of the work function metal layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 is a cross-sectional view of a stage in the formation of an exemplary finFET device according to an embodiment of the invention;

FIG. 3 is a cross-sectional view of the stage in the formation of another exemplary finFET device according to an embodiment of the invention;

FIG. 4 is a cross-sectional view of another stage in the formation of an exemplary finFET device according to an embodiment of the invention;

FIG. 5 is a cross-sectional view of the stage in the formation of another exemplary finFET device according to another embodiment of the invention;

FIG. 6 is a cross-sectional view of another stage in the formation of an exemplary finFET device according to an embodiment of the invention;

FIG. 7 is a cross-sectional view of the stage in the formation of another exemplary finFET device according to another embodiment of the invention;

FIG. 10 is a cross-sectional view of another stage in the formation of an exemplary finFET device according to an embodiment of the invention;

FIG. 11 is a cross-sectional view of the stage in the formation of another exemplary finFET device according to another embodiment of the invention;

FIG. 12 is a cross-sectional view of another stage in the formation of an exemplary finFET device according to an embodiment of the invention;

FIG. 13 is a cross-sectional view of the stage in the formation of another exemplary finFET device according to another embodiment of the invention;

FIG. 14 is a cross-sectional view of another stage in the formation of an exemplary finFET device according to an embodiment of the invention;

FIG. 15 is a cross-sectional view of the stage in the formation of another exemplary finFET device according to another embodiment of the invention;

FIG. 16 is a cross-sectional view of another stage in the formation of an exemplary finFET device according to an embodiment of the invention;

FIG. 17 is a cross-sectional view of the stage in the formation of another exemplary finFET device according to another embodiment of the invention.

DETAILED DESCRIPTION

As noted above, part of the fabrication of an RMG finFET device involves forming a partial recess in the metal gate for formation of a dielectric cap. This partial recessing of the gate metal can present a challenge from the standpoint of the reactive ion etch (RIE) required. In addition, conventional gate metal fill techniques may result in a seam or void within the gate metal layer. Embodiments of the RMG finFET device and process of fabricating the device detailed herein include bottom-up formation through selective metal growth.

Figure 1:
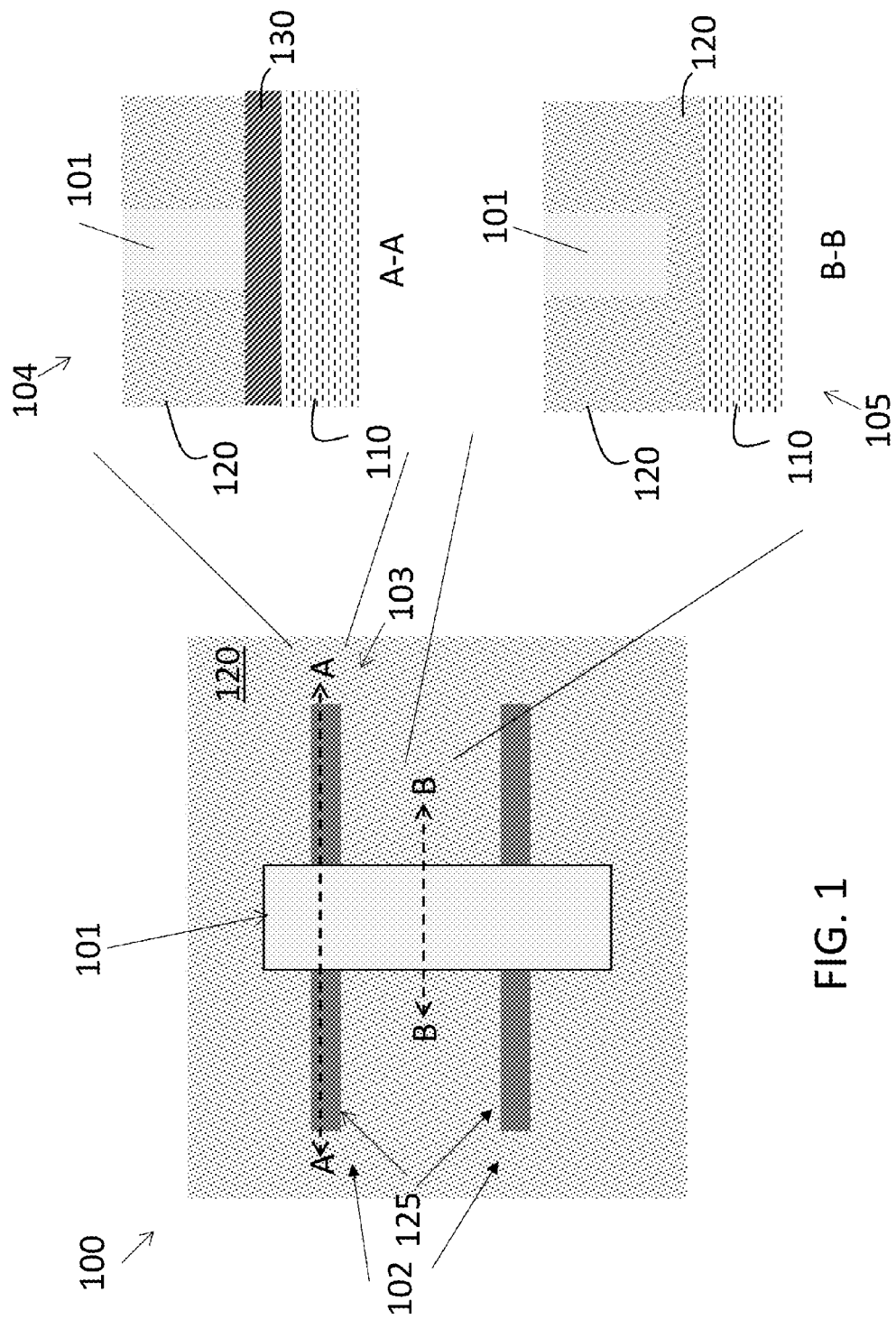
FIG. 1 is a top-down view of a finFET device fabricated according to an embodiment of the invention.

FIG. 1 is a top-down view of a finFET device 100 fabricated according to an embodiment of the invention. The conducting channel between the source and gate is wrapped in a silicon fin 125 and finFETs are generally known. The description herein focuses on the differences in fabrication of a gate region 101. An inter-level dielectric (ILD) 120 including a dielectric material such as silicon oxide or silicon nitride, for example, forms the trench in which the gate region 101 is formed. Two fins 125 wrapped in silicon, for example, are shown with source 102 and drain 103 sides in the exemplary finFET device 100. In alternate embodiments, one or a different number of fins 125 may be formed. The gate region 101 is shown in the top-down view of FIG. 1. Generally, in both currently used processes and according to embodiments of the invention, the gate region 101 is formed by removing and replacing a dummy gate 140 (FIG. 2) with the gate metal 190 (FIGS. 14, 15). As further detailed below with reference to FIGS. 2 through 18, embodiments of the invention relate to bottom-up formation of the replacement gate 101 through growth of the gate metal 190. Two figures are shown for each stage of the processing to illustrate two different gate widths. The stages shown in subsequent figures are cross sectional views across the gate as indicated by A-A.

The cross-sections indicated by A-A and B-B are both detailed in FIG. 1. The cross-section indicated by A-A is through a fin 125. The cross-sectional structure 104 includes a substrate 110 with a silicon layer 130 representing the fin 125 above it. The ILD 120 forms a trench in which the gate region 101 is formed. The cross-section indicated by B-B is through the gate region 101. The cross-sectional structure 105 includes a substrate 110 with ILD 120 formed above and also including the trench in which the gate region 101 is formed. The gate region 101 and its formation are further detailed below. As noted above, FIGS. 2 through 18 show cross-sectional views at A-A.

FIG. 2 is a cross-sectional view of a stage 200-1 in the formation of an exemplary finFET device according to an embodiment of the invention. FIG. 3 is a cross-sectional view of the stage 200-2 in the formation of another exemplary finFET device according to an embodiment of the invention. The trench 121 is wider in stage 200-2 shown in FIG. 3 than the trench 121 shown in FIG. 2. In both stages 200-1 and 200-2 shown in FIGS. 2 and 3, respectively, a silicon layer 130 indicating the fin 125 is shown as being formed on the substrate 110. Above the fin 125 (silicon layer 130), a trench 121 is formed in the ILD 120. The silicon layer 130 may represent an epitaxial merge of the fins 125 shown in FIG. 1. A dummy gate 140 of a poly-silicon or amorphous-silicon is shown beneath a gate hardmask 155 in the trench 121 of the ILD 120. An oxide layer 145, which may be the same material as the ILD 120 or a different oxide is beneath the dummy gate 140. As shown in FIGS. 2 and 3, the gate hardmask 155 is above the dummy gate 140. The same material as the gate hardmask 155 or a different material may acts as a sidewall spacer 150 between the dummy gate 140 and the ILD 120 based on etching. The material of the gate hardmask 155 may be silicon nitride (SiN). For purposes of explaining the embodiments herein, the stages 200-1 and 200-2 shown in FIGS. 2 and 3 are considered the initial stages in the formation of a finFET device 100, because stages preceding stages 200-1 and 200-2 are the same as those of prior finFET device formation processes.

FIG. 4 is a cross-sectional view of another stage 300-1 in the formation of an exemplary finFET device according to an embodiment of the invention. FIG. 5 is a cross-sectional view of the stage 300-2 in the formation of another exemplary finFET device according to another embodiment of the invention. As FIGS. 4 and 5 indicate, the oxide layer 145, dummy gate 140, and gate hardmask 155 are pulled to result in the stages 300-1 and 300-2. Specifically, a dry etch is first performed to etch back the hardmask 155 (which may have some effect on the sidewall spacer 150, as well). Then, a wet etch is performed to etch the dummy gate 140 and oxide layer 145. The sidewall spacer 150, which may be somewhat shortened by the dry etch process, is left as shown in FIGS. 4 and 5.

FIG. 6 is a cross-sectional view of another stage 400-1 in the formation of an exemplary finFET device according to an embodiment of the invention. FIG. 7 is a cross-sectional view of the stage 400-2 in the formation of another exemplary finFET device according to another embodiment of the invention. As FIGS. 6 and 7 indicate, a high dielectric constant (high-k) dielectric layer 160 and a work function metal 170 are deposited conformally along the gate hardmask 150 and on a surface of the silicon layer 130. A blanket conformal deposition is followed by CMP down to the ILD 120. Exemplary materials used for the dielectric layer 160 include hafnium oxide ($HfO_2$), aluminum oxide ($Al_2O_3$), a hafnium silicate ($HfSiO_x$), zirconium dioxide ($ZrO_2$), or a hafnium zirconate ($HfZrO_x$). The work function metal 170 may be tantalum nitride (TaN), titanium nitride (TiN), titanium aluminum carbide (TiAlC), or TiC, for example.

Figures 8, 9:
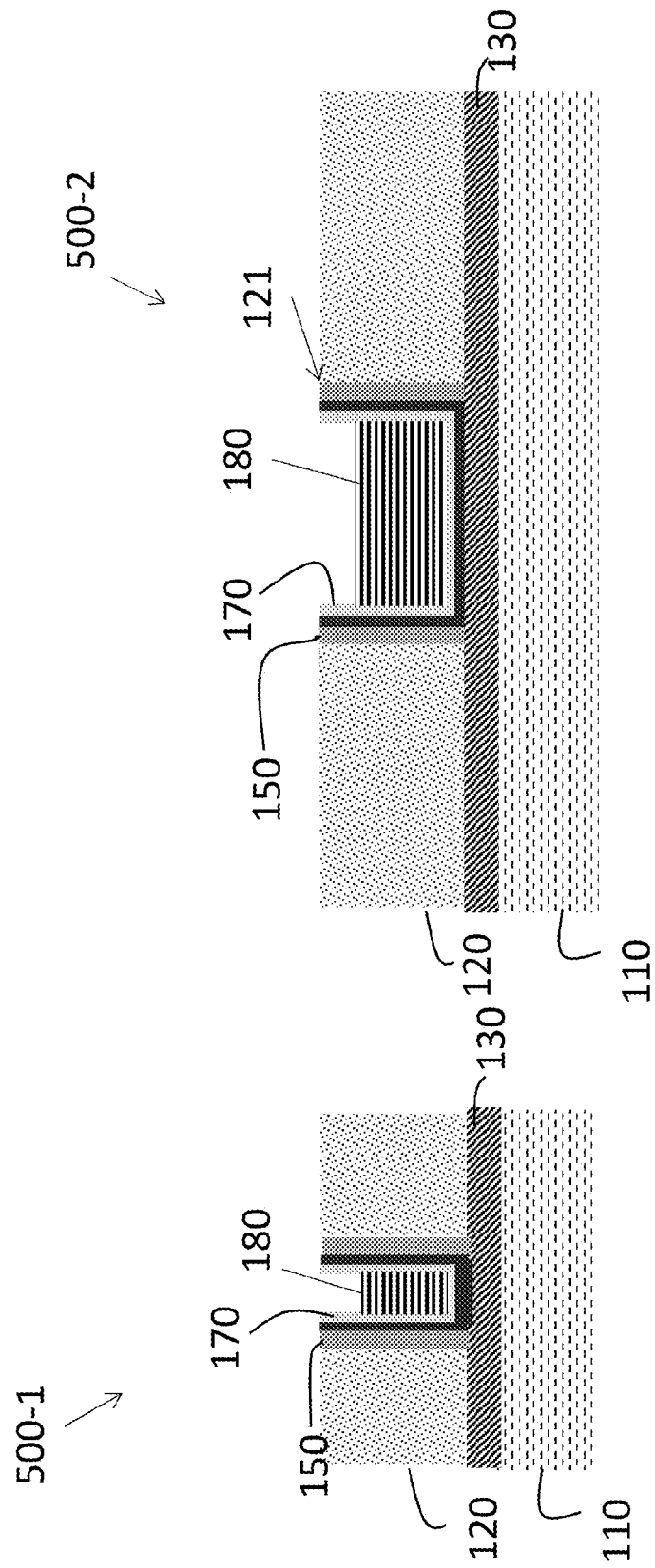
FIG. 8 is a cross-sectional view of another stage in the formation of an exemplary finFET device according to an embodiment of the invention.
FIG. 9 is a cross-sectional view of the stage in the formation of another exemplary finFET device according to another embodiment of the invention.

FIG. 8 is a cross-sectional view of another stage 500-1 in the formation of an exemplary finFET device according to an embodiment of the invention. FIG. 9 is a cross-sectional view of the stage 500-2 in the formation of another exemplary finFET device according to another embodiment of the invention. An organic planarizing layer (OPL) 180 is deposited and etched back below the top of the trench 121, as shown in FIGS. 8 and 9, so that the OPL 180 is recessed in the trench coated with the work function metal 170. The OPL 180 is a photoresist-like material used to reduce the topography. An organic dielectric layer (ODL) may be used as an OPL 180. FIG. 10 is a cross-sectional view of another stage 600-1 in the formation of an exemplary finFET device according to an embodiment of the invention. FIG. 11 is a cross-sectional view of the stage 600-2 in the formation of another exemplary finFET device according to another embodiment of the invention. The work function metal 170 is etched to be partially recessed to the level of the recessed OPL 180. FIG. 12 is a cross-sectional view of another stage 700-1 in the formation of an exemplary finFET device according to an embodiment of the invention. FIG. 13 is a cross-sectional view of the stage 700-2 in the formation of another exemplary finFET device according to another embodiment of the invention. The OPL 180 is stripped leaving the recessed work function metal 170 exposed. The OPL 180 may be stripped with a gas including carbon dioxide, for example.

FIG. 14 is a cross-sectional view of another stage 800-1 in the formation of an exemplary finFET device according to an embodiment of the invention. FIG. 15 is a cross-sectional view of the stage 800-2 in the formation of another exemplary finFET device according to another embodiment of the invention. A gate metal 190 is grown via selective metal growth on the work function metal 170 surface. FIGS. 14 and 15 illustrate a key difference in the embodiments described herein as compared with current processes for forming the replacement gate. The gate metal 190 is grown via selective metal growth such that deposition and etching via RIE is not required according to the embodiments. That is, the work function metal 170 acts as a seeding layer that the gate metal 190 cannot grow without, such that the gate metal 190 grows only on the surfaces of the workfunction metal 170. Thus, due to recessing the work function metal 170 at stages 600-1 and 600-2, the gate metal 190 can be grown to be recessed, as well, without requiring any etching. The gate metal 190 may be tungsten (W), aluminum (Al), cobalt (Co), phosphorous (P), or boron (B), for example. The gate metal 190 may instead be W, P, or B doped with Co, for example. As a comparison of stages 800-1 and 800-2 indicates, when the trench 121 is sufficiently narrow (as in stage 800-1), growth of the gate metal 190 will result in a continuous fill. That is, the growth of the gate metal 190 at the two sides of the trench 121 in the cross-sectional view shown in FIG. 14 will be close enough to form a continuous gate metal 190 layer as shown. To the contrary, the growth of the gate metal 190 at the two sides of the trench 121 in the cross-sectional view shown in FIG. 15 will be sufficiently separated such that a gap 191 will result.

Figure 18:
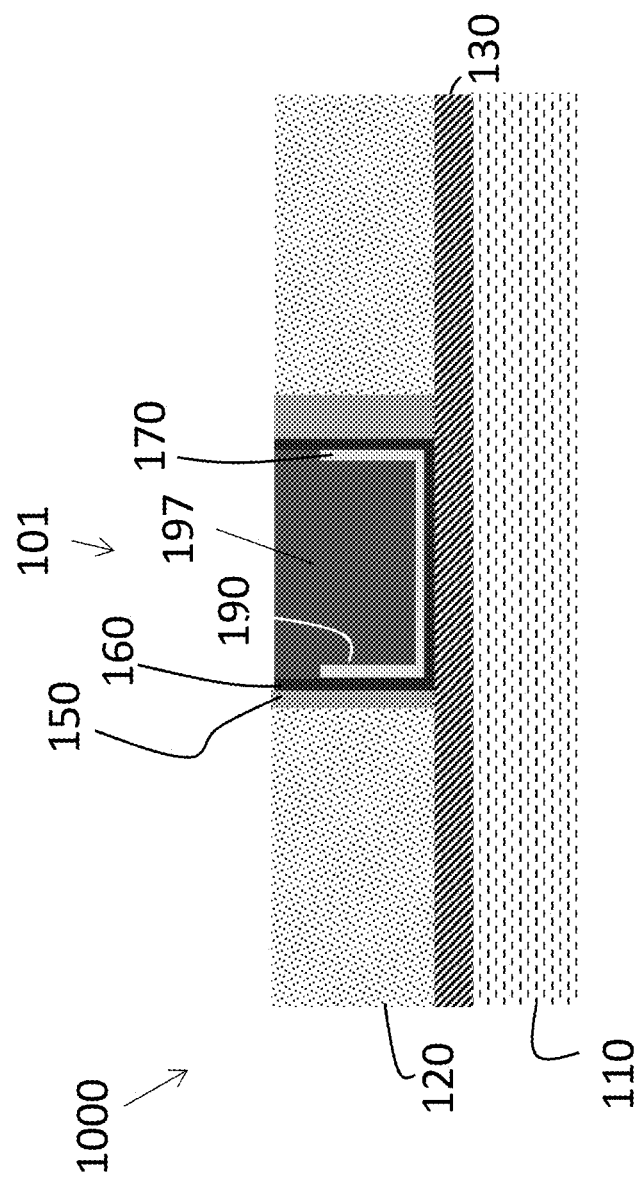
FIG. 18 is a cross-sectional view of another stage in the formation of an exemplary finFET according to an embodiment of the invention.

FIG. 16 is a cross-sectional view of another stage 900-1 in the formation of an exemplary finFET device according to an embodiment of the invention. FIG. 17 is a cross-sectional view of the stage 900-2 in the formation of another exemplary finFET device according to another embodiment of the invention. A dielectric cap 195 is formed over the gate metal 190 in a damascene process. The dielectric cap 195 may be a silicon nitride (SiN) material. The SiN material may be formed at a temperature below 500 degrees Celsius. As FIG. 17 shows, the dielectric cap 195 fills the gap 191, as well. As noted above, no such gap 191 is present in the embodiment shown in FIGS. 14 and 16 such that the dielectric cap 195 is formed above a continuous gate metal 190 layer. FIG. 18 is a cross-sectional view of another stage 1000 in the formation of an exemplary finFET 100 according to an embodiment of the invention. This stage 1000 applies to the finFET device with the relatively wider gate 101 (and, thus, the gap 191). The dielectric cap 195 is removed and a tungsten (W) 197 refill is performed as shown. This W 197 fill provides the necessary gate conductivity that cannot be achieved with the gap 191.

The processes detailed above not only address the challenges associated with obtaining a recessed gate metal but also prevent voids in the gate metal region. That is, conventional gate metal fill techniques are susceptible to developing a seam or void in the gate metal fill. Based on the selective growth described above (and the W fill according to some embodiments), a continuous gate metal layer without any seams or voids is obtained.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a replacement metal gate in a transistor device, the method comprising:
    forming a dummy gate structure over a substrate, the dummy gate structure surrounded by an insulating layer;
    removing the dummy gate structure so as to expose a trench within the insulating layer;
    conformally depositing a dielectric material layer and a work function metal layer over a the insulating layer and in the trench and removing the dielectric material layer and the work function metal layer from a top surface of the insulating layer;
    recessing the work function metal layer below a top of the trench;
    selectively growing a gate metal only on exposed surfaces of the work function metal layer;
    forming a dielectric cap over the gate metal to fill the trench; and
    removing the dielectric cap and performing a metal fill of the trench, wherein the removing the dielectric cap and the performing the metal fill is performed when the selectively growing the gate metal results in a gap within the inner wall of the trench.

2. The method according to claim 1, wherein the forming the dummy gate structure includes depositing a dummy gate over an oxide layer in the trench at a depth less than a depth of the trench.

3. The method according to claim 2, wherein the forming the dummy gate structure also includes forming a hardmask over the dummy gate to fill the depth of the trench.

4. The method according to claim 1, further comprising, prior to the selectively growing the gate metal, forming an organic planarizing layer (OPL) in the trench over the work function metal.

5. The method according to claim 4, further comprising etching the OPL to form a recessed OPL with a thickness less than a depth of the trench.

6. The method according to claim 5, further comprising etching the work function metal to the depth of the recessed OPL.

7. The method according to claim 6, further comprising stripping the OPL prior to selectively growing the gate metal.

8. A finFET device comprising:
a replacement metal gate fabricated according to the method of claim 1; and
source and drain regions with a fin channel region therebetween, the fin channel region extending in an axial direction perpendicular to an axial direction of the replacement metal gate.

9. A method of fabricating a fin field effect transistor (fin-FET) device, the method comprising:
forming a substrate;
forming a fin connecting a source region and a drain region over the substrate;
forming a dummy gate structure over a substrate, the dummy gate structure surrounded by an insulating layer;
removing the dummy gate structure so as to expose a trench within the insulating layer;
conformally depositing a dielectric material layer and a work function metal layer over a the insulating layer and in the trench and removing the dielectric material layer and the work function metal layer from a top surface of the insulating layer;
recessing the work function metal layer below a top of the trench;
selectively growing a gate metal only on exposed surfaces of the work function metal layer;
forming a dielectric cap over the gate metal to fill the trench; and
removing the dielectric cap and performing a metal fill of the trench, wherein the removing the dielectric cap and the performing the metal fill is performed when the selectively growing the gate metal results in a gap within the inner wall of the trench.

10. The method according to claim 9, wherein the forming the dummy gate structure includes depositing a dummy gate in the trench at a depth less than a depth of the trench.

11. The method according to claim 10, wherein the forming the dummy gate structure also includes forming a hardmask over the dummy gate to fill the depth of the trench.

12. The method according to claim 9, further comprising, prior to the selectively growing the gate metal, forming an organic planarizing layer (OPL) in the trench over the work function metal.

13. The method according to claim 12, further comprising etching the OPL to form a recessed OPL with a thickness less than a depth of the trench.

14. The method according to claim 13, further comprising etching the work function metal to the depth of the recessed OPL, and stripping the OPL prior to selectively forming the gate metal.

* * * * *